(12) United States Patent
Fang et al.

(10) Patent No.: US 6,274,413 B1
(45) Date of Patent: Aug. 14, 2001

(54) METHOD FOR FABRICATING A POLYSILICON THIN FILM TRANSISTOR

(75) Inventors: Yean-Kuen Fang, Tainan; Dun-Nien Yang, Taipei; Yung-Chi Wang, Kaohsiung, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/481,888

(22) Filed: Jan. 12, 2000

(30) Foreign Application Priority Data

Feb. 2, 1999 (TW) ................................................ 88101594

(51) Int. Cl.[7] .............................. H01L 21/00; H01L 21/84
(52) U.S. Cl. ........................ 438/149; 438/158; 438/265
(58) Field of Search ................................... 438/149, 158, 438/163, 189, 242, 787, 197, 257, 265, 288, 299; 257/66, 336, 401, 659, 903, 288, 314, 315, 316, 321

(56) References Cited

U.S. PATENT DOCUMENTS

| | | | |
|---|---|---|---|
| 5,661,051 | * 8/1997 | Yeh et al. | 438/158 |
| 5,693,959 | * 12/1997 | Inoue et al. | 257/66 |
| 5,796,150 | * 8/1998 | Wuu et al. | 257/401 |
| 6,117,733 | * 9/2000 | Sung et al. | 438/265 |

* cited by examiner

Primary Examiner—David Nelms
Assistant Examiner—Phuc T. Dang
(74) Attorney, Agent, or Firm—Peter F. Corless; Edwards & Angell, LLP

(57) ABSTRACT

A method for fabricating a polysilicon thin film transistor combining the channel oxidation process and the plasma hydrogenation process is disclosed. The fabrication process includes the following steps: (a) forming a field oxide layer on a silicon substrate, (b) forming a polysilicon layer on a portion of the field oxide layer to serve as a gate, (c) forming a gate oxide on the polysilicon layer and another portion of the field oxide layer, (d) forming a polysilicon channel on the gate oxide layer, (e) defining a source region and a drain region in a portion of the polysilicon channel, (f) oxidizing another portion of the polysilicon channel, (g) forming a dielectric layer on said polysilicon channel, and (h) hydrogenating said polysilicon thin film transistor by plasma. Such a combination results in an better efficiency for passivating the tail state traps, and can prevent the polysilicon thin film from being damaged caused by the plasma glow during the plasma hydrogenation process. The polysilicon thin film transistor formed thereby has a lower subthreshold swing, higher on/off current ratio, and excellent reliability.

20 Claims, 8 Drawing Sheets

METHOD FOR FABRICATING A POLYSILICON THIN FILM TRANSISTOR

FIELD OF THE INVENTION

The present invention is related to a method for fabricating a polysilicon thin film transistor.

BACKGROUND OF THE INVENTION

As the development of the integrated circuit is now mushrooming, the polysilicon thin film transistor grown by the low pressure chemical vapor deposition (LPCVD) is extensively employed in the application of liquid crystal display (LCD) and high-density static random access memory. As an example, the active-matrix LCD (AM-LCD) which is the most dominant LCD product adopts the thin film transistor (TFT) as the display unit. Accordingly, the AM-LCD is power-saving and is able to display both the grayscale and the color. However, because there are a great deal of traps at the grain boundary in the polysilicon thin film, the polysilicon thin film transistor has larger threshold voltage and worse subthreshold swing. It has been reported that the plasma hydrogenation process is an efficient method to passivate these trap states. Nevertheless, the UV emitted from the discharged plasma glow will damage the boundary of the polysilicon/silicon oxide. Moreover, the plasma hydrogenation process brings about a low efficiency in passivating the tail state traps thereby limiting its applications. In conclusion, the conventional fabrication process for a polysilicon thin film transistor has the following shortcomings:

1. It is inefficient to passivate the tail state traps if the plasma hydrogenation process is combined into the conventional fabrication process for fabricating the polysilicon thin film transistor.

2. It will somewhat damage the boundary of the polysilicon/silicon oxide if the plasma hydrogenation process is combined into the conventional fabrication process for fabricating the polysilicon thin film transistor.

3. There is another approach for improving the characteristics of the polysilicon thin film transistor, that is, the channel oxidation process. The channel oxidation process provides a better efficiency for passivating the tail state traps than the plasma hydrogenation process does, and can prevent the damage caused by the UV emitted from the discharged plasma glow during the plasma hydrogenation process. Nevertheless, the application of channel oxidation will be limited as the gate oxide is getting thick.

Therefore, it is tried by the applicant to minimize the damage caused by the UV emitted from the discharged plasma glow and increase the efficiency for passivating the tail state traps.

SUMMARY OF THE INVENTION

An object of the present invention is to provide a process for fabricating the polysilicon thin film transistor for minimizing the damage cause by UV emitted from the discharged plasma glow during plasma hydrogenation process and improving the efficiency for passivating the tail state traps.

Another object of the present invention is to provide a process for fabricating the polysilicon thin film transistor for shortening the fabrication time and reducing the leakage current.

Another further object of the present invention is to provide a process for fabricating the polysilicon thin film transistor for preventing the gate oxide from getting thick, increasing the on/off current ratio, and lowering the subthreshold swing.

According to the present invention, the channel oxidation process and the plasma hydrogenation process are combined into the fabrication process for a polysilicon thin film transistor. The polysilicon thin film transistor is fabricated by the following steps: (a) forming an oxide layer on a substrate, (b) forming a polysilicon layer on a portion of the oxide layer to serve as a gate, (c) forming a gate oxide on the polysilicon layer and another portion of the oxide layer, (d) forming a polysilicon channel on the gate oxide layer, (e) defining a source region and a drain region in a portion of the polysilicon channel, (f) oxidizing the polysilicon channel, (g) forming a dielectric layer on the polysilicon channel, and (h) hydrogenating the polysilicon thin film transistor by plasma.

In accordance with the present invention, the substrate is an N-type silicon substrate.

Preferably, the oxide layer is a field oxide with a thickness of 5000 Å.

In accordance with the present invention, the polysilicon layer is formed by low pressure chemical vapor deposition (LPCVD).

Preferably, the polysilicon layer has a thickness of 550 Å.

In accordance with the present invention, the gate is formed by implanting phosphine ($PH_3$) ions with a dosage of $5 \times 10^{15} cm^{-2}$ into the polysilicon layer.

In accordance with the present invention, the gate oxide is formed by the low pressure chemical vapor deposition (LPCVD). Preferably, the gate oxide has a thickness of 300 Å.

After the gate oxide is formed, the gate oxide is further treated by a subsequent heat treatment at an ambient temperature of 800° C.

In accordance with the present invention, the polysilicon channel is formed by the steps of: first, forming an amorphous silicon layer with a thickness of 300 Å on the gate oxide by low pressure chemical vapor deposition (LPCVD) at an ambient temperature of 525° C. Second, annealing the amorphous silicon layer to form a recrystallized polysilicon layer in the presence of a nitrogen gas at a temperature of 600° C. Third, implanting phosphorous ions with a dosage of $5 \times 10^{12} cm^{-2}$ into the recrystallized polysilicon layer to form the polysilicon channel.

In accordance with the present invention, the drain region and the source region are formed by implanting boron ions with a dosage of $5 \times 10^{15} cm^{-2}$ into the portion of the polysilicon channel.

In accordance with the present invention, after the source region and the drain region are formed, the polysilicon channel is oxidized by a thermal oxidation process at a preferably temperature of 800° C. for one hour.

In accordance with the present invention, the dielectric layer is a borophosphosilicate glass (BPSG) layer with a thickness of 6000 Å, and after the BPSG layer is formed, the BPSG layer is further treated by a high-temperature flow process at a temperature ranged from 850° C. to 950° C.

In accordance with the present invention, before the step of hydrogenating the polysilicon thin film transistor by plasma, the method further includes the steps of: (a) forming contact windows on the drain region and the source region respectively, (b) depositing a metal layer in the drain region and the source region to provide a drain contact and a source contact for said drain region and source region respectively, (c) forming a first passivation layer on the dielectric layer, and (d) forming a second passivation layer on the first passivation layer, thereby forming the polysilicon thin film transistor.

In accordance with the present invention, the step of hydrogenating the polysilicon thin film transistor by plasma is executed in a plasma enhanced chemical vapor deposition (PECVD) system for four hours.

Now the foregoing and other features and advantages of the present invention will be more clearly understood through the following descriptions with reference to the accompanying drawings, in which:

DETAILED DESCRIPTION OF THE PREFERRED EMBODIMENTS

The present invention is based on the knowledge that the channel oxidation process can bring about a higher efficiency for passivating the tail state traps than the plasma hydrogenation process and is able to passivate the traps at the boundary of polysilicon/silicon oxide so as to minimize the damage caused by the UV emitted during the plasma hydrogenation process. By combining the plasma hydrogenation process and the channel oxidation process into the fabrication process for the polysilicon thin film transistor, the fabrication time will be reduced, and the reliability of the polysilicon thin film transistor will be increased.

Figure 1:
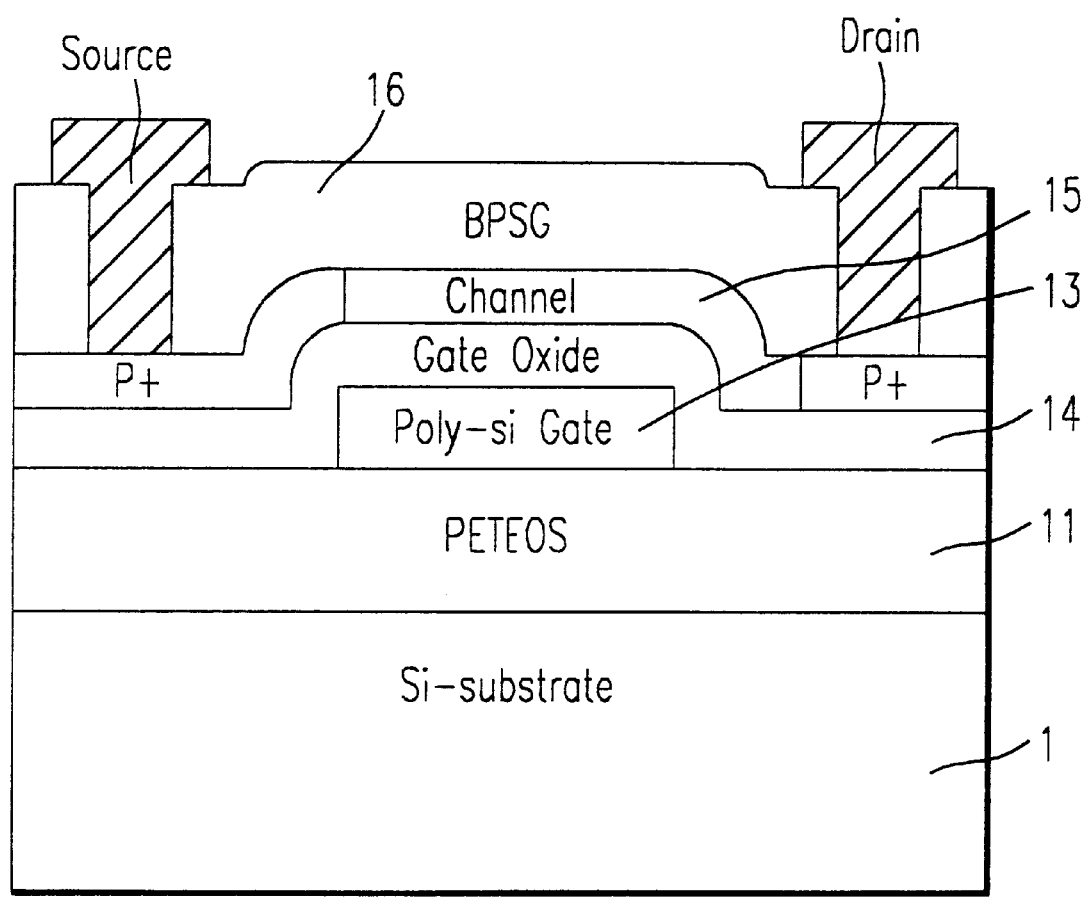
FIG. 1 is a schematic diagram showing the polysilicon thin film transistor structure of the present invention.

Please refer to FIG. 1 which shows the polysilicon thin film transistor structure of the present invention. The silicon substrate 1 is an N-type silicon substrate with 3–4 Ωcm (100). A field oxide layer 11 with a thickness of 5000 Å is grown on the substrate 1, and a polysilicon thin film 13 with a thickness of 550 Å is deposited on a portion of the field oxide layer 11. The phosphine ($PH_3$) ions are implanted into the polysilicon thin film 13 so as to form an $N^+$ gate.

Subsequently, a gate oxide 14 with a thickness of 300 Å is grown on the polysilicon thin film 13 and a portion of the field oxide layer 11. A polysilicon channel 15 is further formed on the gate oxide 14. After creating the source region and the drain region, a borophosphosilicate glass (BPSG) layer 16 with a thickness of 6000 Å is deposited on the polysilicon channel 15.

Figure 2:
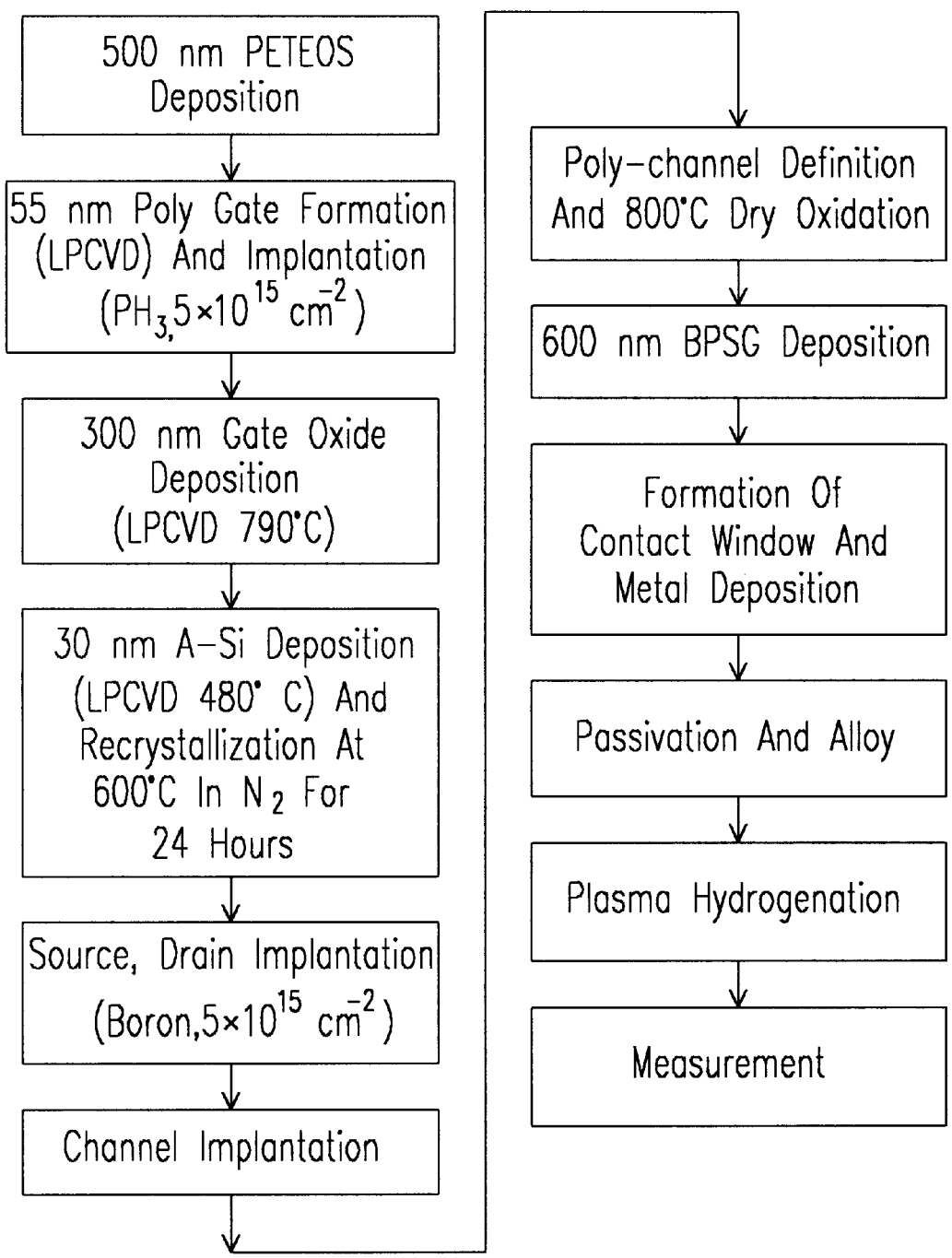
FIG. 2 is a flow chart illustrating the steps for fabricating a polysilicon thin film transistor according to the present invention.

Please refer to FIG. 2 which is a flow chart illustrating the steps for fabricating the polysilicon thin film transistor according to the present invention. First, a silicon substrate 1 is provided. Preferably, the silicon substrate 1 is an N-type silicon substrate with 3–4 Ωcm (100). Then, a field oxide layer 11 with a thickness of 5000 Å is grown on the silicon substrate 1. Subsequently, a polysilicon thin film 13 with a thickness of 550 Å is deposited on a portion of the field oxide layer 11 by the low pressure chemical vapor deposition (LPCVD), and phosphine ($PH_3$) ions with a dosage of $5 \times 10^{15}$ $cm^{-2}$ are implanted into the polysilicon thin film 13 in order to form an $N^+$ gate. A gate oxide 14 with a thickness of 300 Å is formed on the polysilicon thin film 13 and another portion of the field oxide layer 11 by the low pressure chemical vapor deposition (LPCVD) at a temperature of 790° C. The gate oxide 14 is further thermally treated at a temperature of 800° C. so that the gate oxide 14 will be more dense. An amorphous silicon layer with a thickness of 300 Å is formed on the gate oxide 14 by the LPCVD at a temperature of 525° C. and be further treated by an annealing process in the presence of nitrogen gas at a temperature of 600° C. for 24 hours. The amorphous silicon layer is recrystallized and the phosphorus ions with a dosage of $5 \times 10^{12}$ $cm^{-2}$ are implanted into the recrystallized amorphous silicon layer for defining a source region and a drain region. Then, the boron ions with a dosage of $5 \times 10^{15}$ $cm^{-2}$ are implanted into the drain region and the source region for forming polysilicon channel 15. After the polysilicon channel is formed, a dry oxygen gas is introduced into the heating tube and the polysilicon channel is further thermally treated in the heating tube at a temperature of 800° C. for several hours so as to complete the channel oxidation process. A borophosphosilicate glass (BPSG) layer 16 with a thickness of 6000 Å is further deposited on the polysilicon channel 15 after the channel oxidation process is completed, and the semiconductor device is transferred to a heating tube at a temperature ranged from 850° C. to 950° C. for a while to planarize the BPSG layer by the high-temperature flow. A plurality of contact windows are formed in the source region and the drain region and the metals are deposited in the contact windows for making contacts, and a passivation layer is formed thereon. Eventually, the semiconductor device is treated by the plasma hydrogenation process in a PECVD system for several hours. It can be understood from the foregoing description that the main characteristic of the present invention is to combine the channel oxidation process and the plasma hydrogenation process into the conventional fabrication process for a polysilicon thin film transistor, thereby solving the problems encountered in the prior art. The channel oxidation process can passivate the tail state traps more efficiently and protect the boundary of the polysilicon/silicon oxide from being damaged during the plasma hydrogenation process. Therefore, comparing the present invention with the conventional fabrication process for a polysilicon thin film transistor utilizing the plasma hydrogenation only, the present invention can shorten the fabrication time and increase the reliability of the polysilicon thin film transistor.

Figure 3:
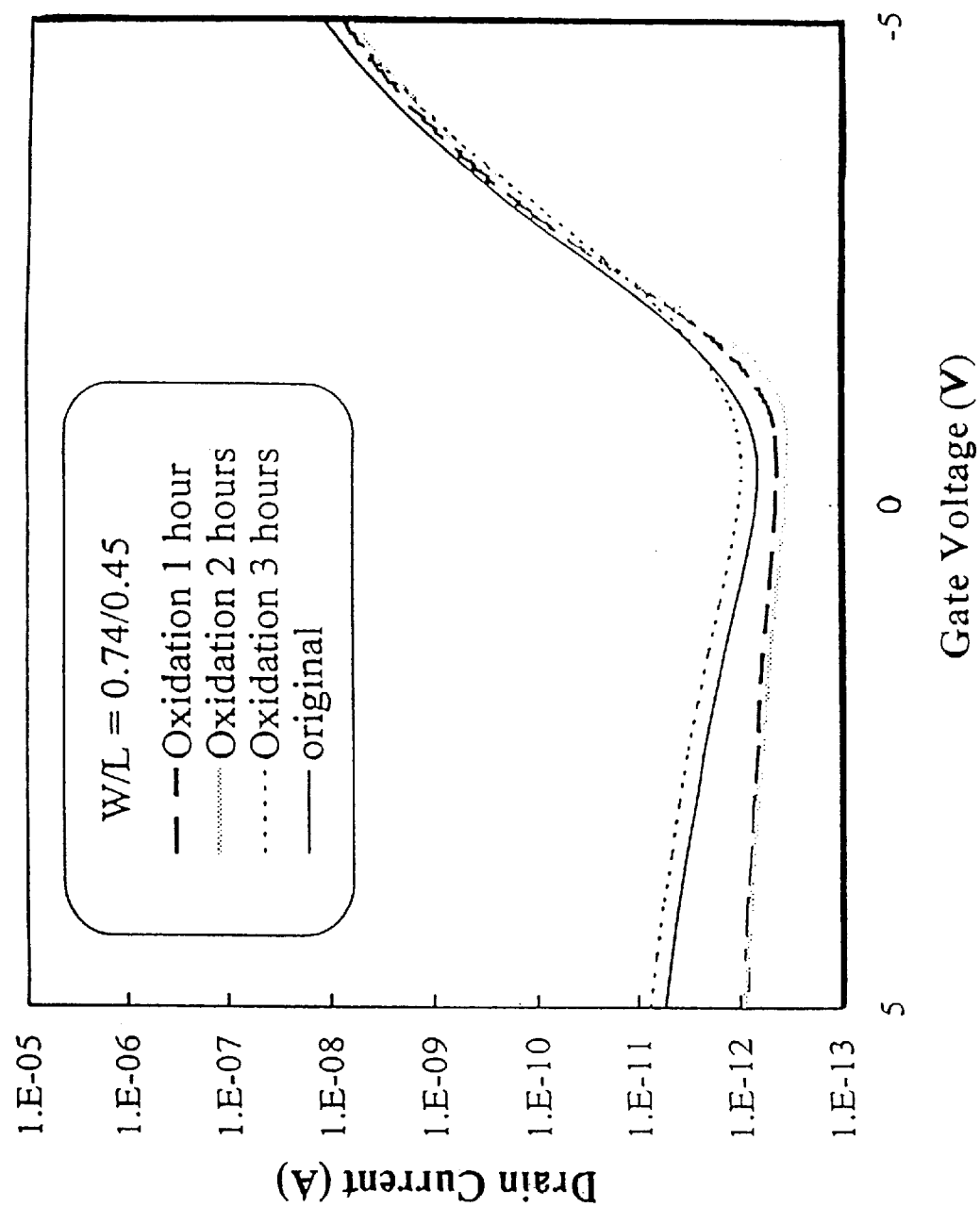
FIG. 3 is a plot showing the drain current—gate voltage characteristics of the polysilicon thin film transistor at different channel oxidation processing time.

Please refer to FIG. 3 which is a plot showing the drain current—gate voltage characteristics at different channel oxidation processing time, wherein the aspect ratio of the polysilicon channel is 0.74/0.45 μm. The fabrication process for these samples are analogous to the fabrication described above except the plasma hydrogenation process is eliminated. It can be seen from FIG. 3 that the polysilicon thin film transistor after one-hour or two-hour channel oxidation processing time have a better subthreshold slope and off-state current. However, the polysilicon thin film transistor after three-hour channel oxidation processing time will have a bad characteristic, and even worse than that before performing the channel oxidation process. That indicates that if the oxidation time is too long, the gate oxide is getting thick to make the characteristic of the polysilicon thin film transistor worse. Hence, the channel oxidation time can not be too long if the dimension of the polysilicon thin film transistor is sub-micron. Table 1 shows the subthreshold swing, threshold voltage, and the off-state current of the samples of FIG. 3:

TABLE 1

| W/L = 0.74/0.45 (μm) | S (mv/dec) Subthreshold swing | $V_T$ (V) Threshold voltage | $I_{off}$ (fA) Off-state current |
|---|---|---|---|
| No oxidiztion | 710 | −10.8 | 670 |
| Oxidization 1 hour | 656 | −10 | 421 |
| Oxidization 2 hours | 573 | −9.89 | 340 |
| Oxidization 3 hours | 741 | −12.67 | 970 | where both the gate voltage and the source voltage are 0 V, and the drain voltage is −3.3 V.

Figure 4:
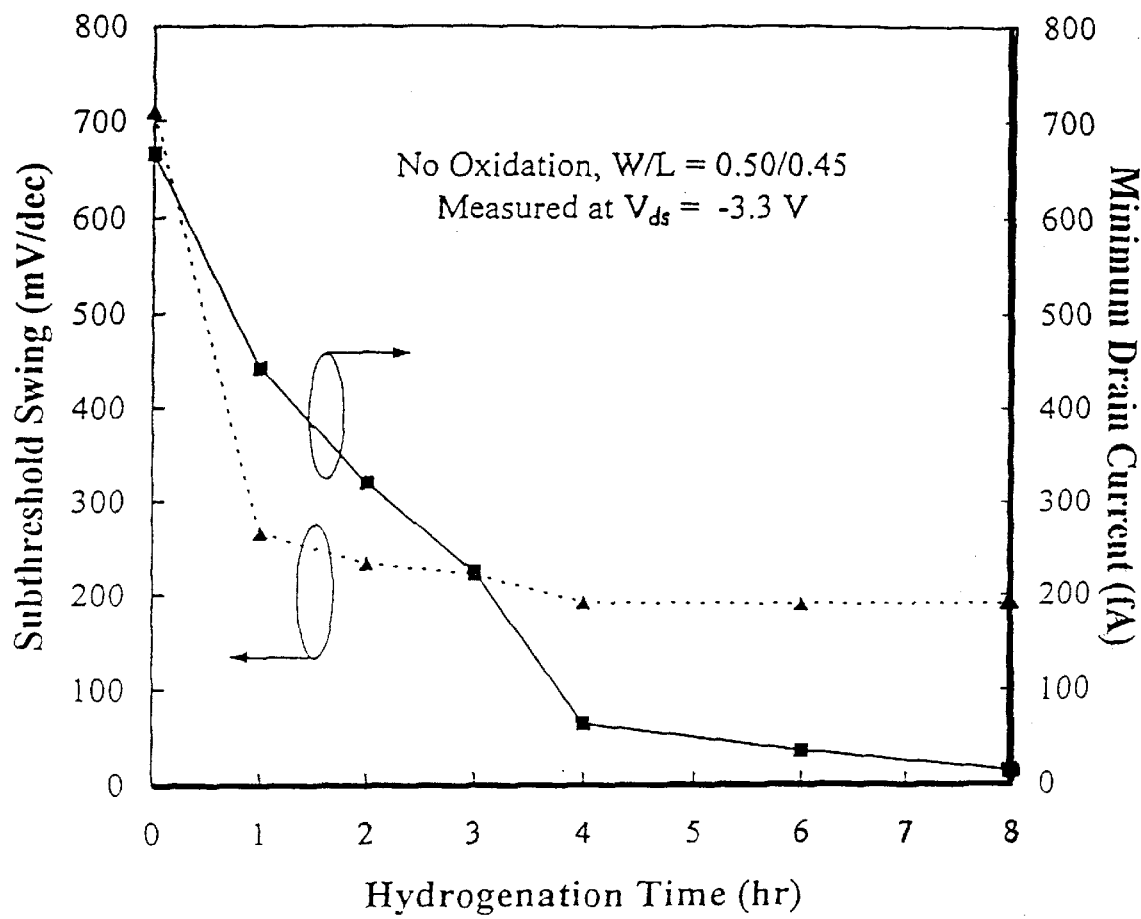
FIG. 4 is a plot showing the subthreshold swing—minimum drain current characteristics of the polysilicon thin film transistor at different plasma hydrogenation processing time respectively.

Please refer to FIG. 4 which is a plot showing the subthreshold swing—minimum drain current characteristics of the polysilicon thin film transistor at different plasma hydrogenation processing time. The fabrication process for these samples are analogous to the fabrication described above except the channel oxidation process is eliminated. It can be seen from FIG. 4 that the subthreshold swing has a transparent improvement through one-hour plasma hydrogenation process, and the saturated state is reached after the four-hour plasma hydrogenation process. With regard to the minimum drain current, it will reach saturation after the eight-hour plasma hydrogenation process. It is easily understood that the plasma hydrogenation process has a greater influence on the subthreshold swing than on the minimum drain current.

Figure 5:
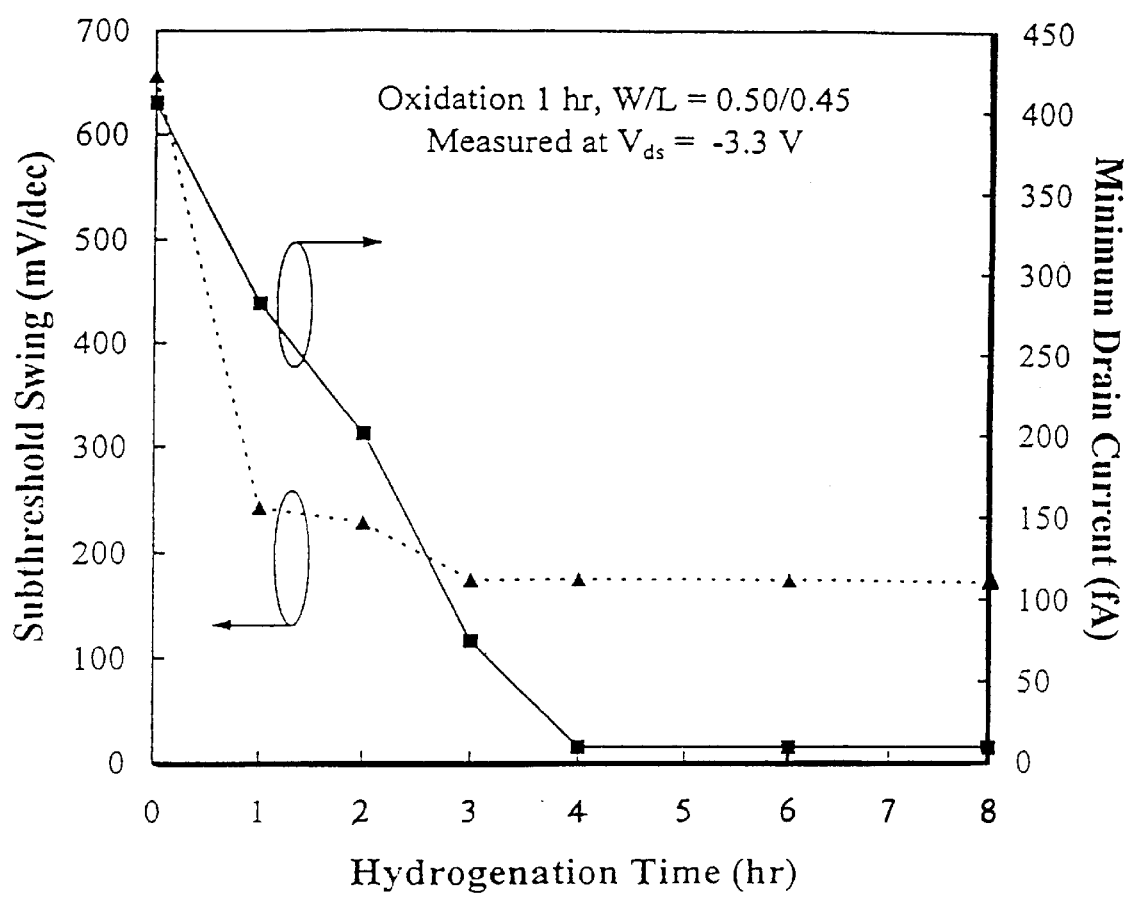
FIG. 5 is a plot showing the subthreshold swing—minimum drain current characteristics of the polysilicon thin film transistor at different plasma hydrogenation processing time after the channel is oxidized for one hour.

Please refer to FIG. 5 which is a plot showing the subthreshold swing—minimum drain current characteristics of the polysilicon thin film transistor under one-hour channel oxidation process plus one-hour, two-hour, three-hour, four-hour, six-hour, and eight-hour plasma hydrogenation process respectively. Comparing the result of FIG. 5 with that of FIG. 4 and taking the subthreshold swing into account, it can be known that the channel oxidation process has no transparent influence on the subthreshold swing. Through the one-hour channel oxidation and three-hour plasma hydrogenation, the subthreshold swing becomes saturated. On the contrary, the channel oxidation has a significant influence on the minimum drain current. The minimum drain current will reach saturation through one-hour channel oxidation process and four-hour plasma hydrogenation.

Figure 6:
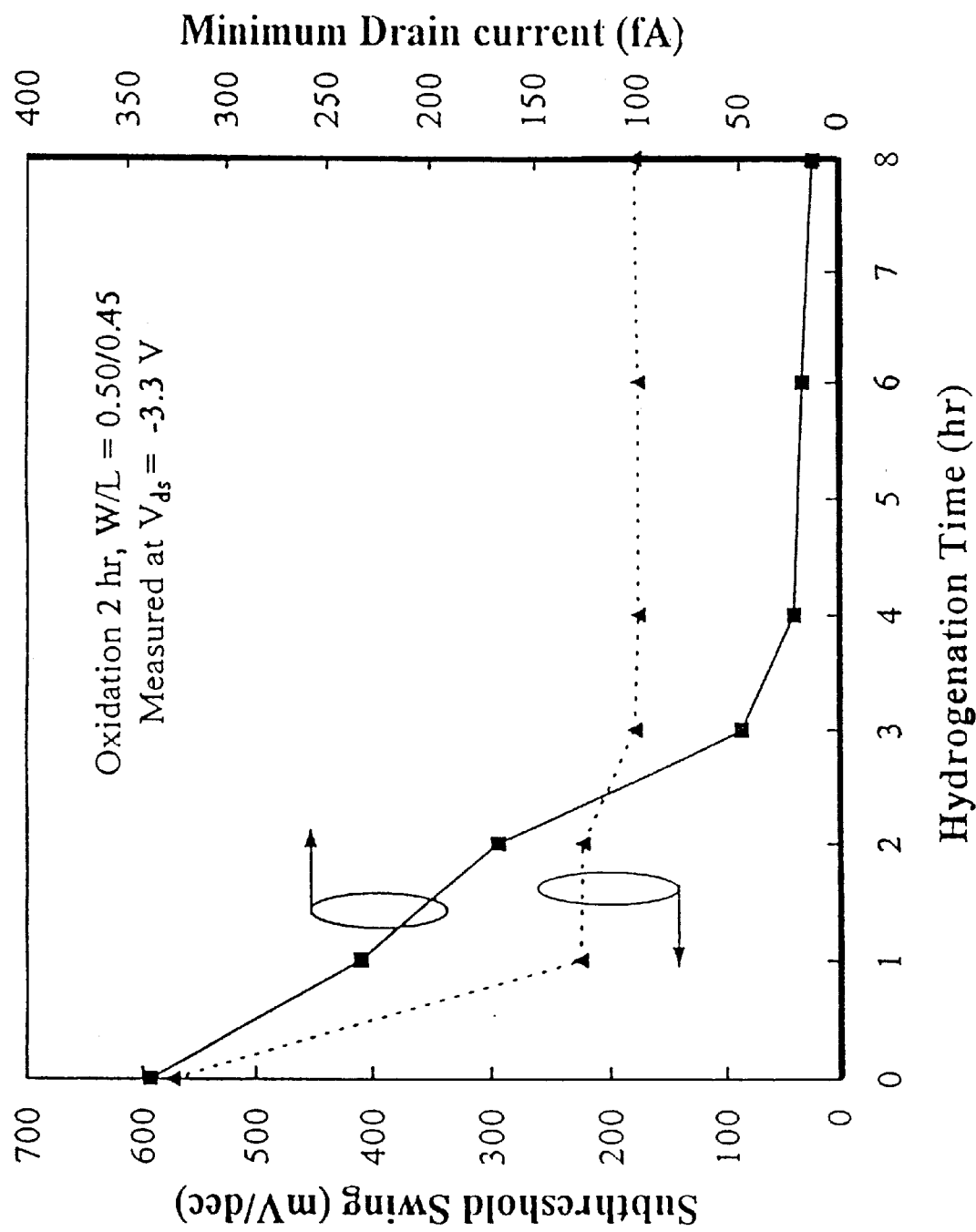
FIG. 6 is a plot showing the subthreshold swing—minimum drain current characteristics of the polysilicon thin film transistor at different plasma hydrogenation processing time after the channel is oxidized for two hours.

Please refer to FIG. 6 which is a plot showing the subthreshold swing—minimum drain current characteristics of the polysilicon thin film transistor under two-hour channel oxidation process plus one-hour, two-hour, three-hour, four-hour, six-hour, and eight-hour plasma hydrogenation process respectively. Comparing the result of FIG. 6 with that of FIG. 5, it can be found that the variation between FIG. 5 and FIG. 6 is small. It indicates that when the aspect ratio of the channel is 0.50/0.45 μm, the processing time of the channel oxidation can be adjusted to one hour to attain the best performance for the polysilicon thin film transistor.

Figure 7:
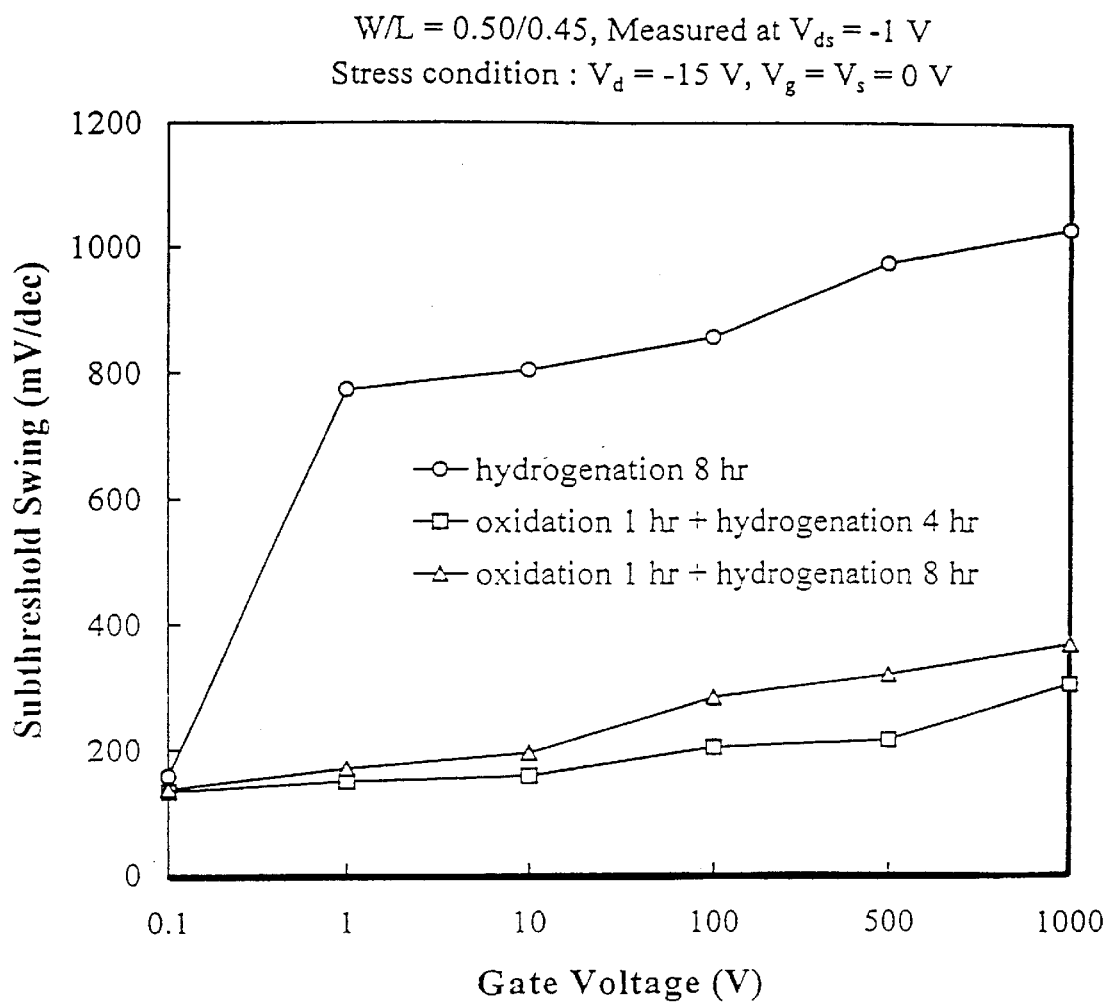
FIG. 7 is a plot showing the subthreshold swing—stress time characteristics of the polysilicon thin film transistor under one-hour channel oxidation process plus eight-hour plasma hydrogenation process, one-hour channel oxidation process plus four-hour plasma hydrogenation process, and eight-hour plasma hydrogenation process respectively.

Please refer to FIG. 7 which is a plot showing the subthreshold swing—stress time characteristics of the polysilicon thin film transistor under one-hour channel oxidation process plus eight-hour plasma hydrogenation process, one-hour channel oxidation process plus four-hour plasma hydrogenation process, and eight-hour plasma hydrogenation process respectively. It can be seen from FIG. 7 that the declination of the subthreshold swing of the polysilicon thin film transistor under one-hour channel oxidation plus eight-hour plasma hydrogenation is greatly reduced in comparison with that of the polysilicon thin film transistor under eight-hour plasma hydrogenation. That proves the channel oxidation process can effectively prevent the boundary of the polysilicon/silicon oxide from being damaged by the UV during the plasma hydrogenation process. Nevertheless, one-hour channel oxidation processing plus four-hour plasma hydrogenation processing will drive the subthreshold swing and the minimum drain current to reach the saturated value, and the saturated value is better than that of the polysilicon thin film transistor under eight-hour plasma hydrogenation. Therefore, comparing the polysilicon thin film transistor under one-hour channel oxidation plus four-hour plasma hydrogenation with that under one-hour channel oxidation plus eight-hour plasma hydrogenation, the subthreshold swing of the former polysilicon thin film transistor is reduced because of the shortened processing time for the plasma hydrogenation. It can be understood that the incorporation of the channel oxidation process will not only minimize the damage caused by the UV during the plasma hydrogenation, but shorten the processing time of the plasma hydrogenation.

Figure 8:
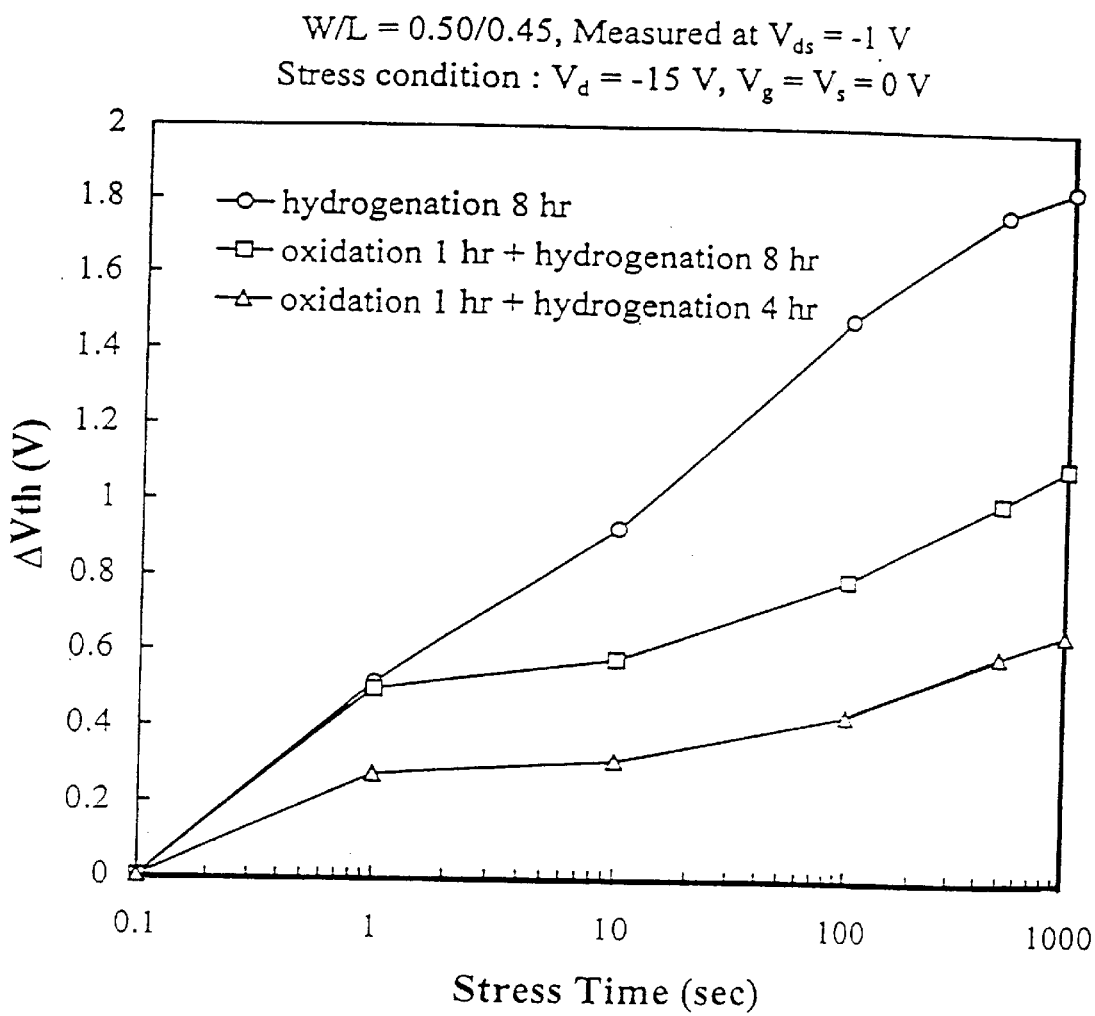
FIG. 8 is a plot showing the subthreshold voltage—stress time characteristics of the polysilicon thin film transistor under one-hour channel oxidation process plus eight-hour plasma hydrogenation process, one-hour channel oxidation process plus four-hour plasma hydrogenation process, and eight-hour plasma hydrogenation process respectively.

Please refer to FIG. 8 which is a plot showing the subthreshold voltage—stress time characteristics of the polysilicon thin film transistor under one-hour channel oxidation plus eight-hour plasma hydrogenation, one-hour channel oxidation plus four-hour plasma hydrogenation, and eight-hour plasma hydrogenation respectively. It can be seen from FIG. 8 that the result of FIG. 8 is analogous to that of FIG. 7, which proves that the reliability of the polysilicon thin film transistor is increased. Table 2 shows the subthreshold swing, on-state current, off-state current, and on/off current ratio of the samples of FIG. 8:

TABLE 2

| W/L = 0.50/0.45 (μm) | Subthreshold swing (mV/dec) | On-state current (μA) | Off-state current (fA) | On/Off current ratio |
|---|---|---|---|---|
| Eight-hour hydrogenation | 157.9 | 0.61 | 4.94 | $1.2 \times 10^8$ |
| One-hour oxidization + four-four hydrogenation | 133.6 | 0.48 | 5.3 | $9.1 \times 10^7$ |
| One-hour oxidization + eight-hour hydrogenation | 137.6 | 0.44 | 2.03 | $2.2 \times 10^8$ | where the on-state current is measured when the gate voltage and the source voltage are both −1 V, and the source voltage is 0 V. Besides, the minimum drain current is measured as the drain voltage is −1 V, and the source voltage and the gate voltage are both 0 V.

Giving an example of one-hour channel oxidation plus four-hour plasma hydrogenation, the plasma hydrogenation processing time can be reduced if the channel oxidation process is incorporated before the plasma hydrogenation process. Also, the subthreshold swing and the off-state current are lowered to 133.6 mV/sec and 5.3 fA respectively.

According to the above statements, the combination of the channel oxidation process and the plasma hydrogenation process can effectively improve the defects of the conventional fabrication process for a polysilicon thin film transistor. The damage caused by the UV during the plasma hydrogenation process is minimized, the gate oxide will not thicken during the channel oxidation process, and the capability for passivating the tail state traps is better.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claim is:

1. A method for fabricating a polysilicon thin film transistor, comprising the steps of:
   (a) forming an oxide layer on a substrate;
   (b) forming a polysilicon layer on a portion of said oxide layer to serve as a gate;
   (c) forming a gate oxide on said polysilicon layer and another portion of said oxide layer;
   (d) forming a polysilicon channel on said gate oxide layer;
   (e) defining a source region and a drain region in a portion of said polysilicon channel;
   (f) oxidizing said polysilicon channel;
   (g) forming a dielectric layer of borophosphosilicate (BPSG) on said polysilicon, channel; and
   (h) hydrogenating said polysilicon thin film transistor by plasma.

2. A method according to claim 1, wherein said substrate is an N-type silicon substrate.

3. A method according to claim 2, wherein said oxide layer is a field oxide layer with a thickness of about 5000 Å.

4. A method according to claim 1, wherein said polysilicon layer is formed by low pressure chemical vapor deposition (LPCVD).

5. A method according to claim 4, wherein said polysilicon layer has a thickness of 550 Å.

6. A method according to claim 1, wherein in said step (b), said gate is formed by implanting ions into said polysilicon layer.

7. A method according to claim 6, wherein said ions are phosphine ($PH_3$) ion with a dosage of $5 \times 10^{15}$ cm$^{-2}$.

8. A method according to claim 1, wherein said gate oxide is formed by low pressure chemical vapor deposition (LPCVD).

9. A method according to claim 8, wherein said gate oxide has a thickness of 300 Å.

10. A method according to claim 1, wherein after said step (c), said method further includes the step of:
    (c1) thermally treating said gate oxide at an ambient temperature of 800° C.

11. A method according to claim 1, wherein said polysilicon channel is formed by the steps of:
    forming an amorphous silicon layer on said gate oxide by low pressure chemical vapor deposition (LPCVD) at an ambient temperature of 525° C.;
    annealing said amorphous silicon layer to form a recrystallized polysilicon layer in the presence of nitrogen gas at an ambient temperature of 600° C.; and
    implanting phosphorous ions with a dosage of $5 \times^{12}$ cm$^{-2}$ into said recrystallized polysilicon layer to form said polysilicon channel.

12. A method according to claim 11, wherein said amorphous silicon layer has a thickness of 300 Å.

13. A method according to claim 1, wherein in said step (f), said drain region and said source region are formed by implanting boron ions with a dosage of $5 \times 10^{15}$ cm$^{-2}$ into said portion of said polysilicon channel.

14. A method according to claim 1, wherein said step (f) is performed by thermal oxidation process at an ambient temperature of 800° C.

15. A method according to claim 14, wherein the processing time of said thermal oxidation process is one hour.

16. A method according to claim 1, wherein said dielectric layer has a thickness of 6000 Å.

17. A method according to claim 1, wherein after said step (g), said method further includes the step of:
    (g1) planarizing said dielectric layer by high-temperature flow process at a temperature ranged from 850° C. to 950° C.

18. A method according to claim 17, wherein after said step (g1), said method further includes the steps of:
    (g2) forming contact windows on said drain region and said source region;
    (g3) depositing a metal layer in said contact windows to provide a drain contact and a source contact for said drain region and said source region respectively;
    (g4) forming a first passivation layer on said dielectric layer; and
    (g5) forming a second passivation layer on said first passivation layer, thereby forming said polysilicon thin film transistor.

19. A method according to claim 1, wherein said step (h) is executed in a plasma enhanced chemical vapor deposition (PECVD) system.

20. A method according to claim 19, wherein the processing time of hydrogenating said polysilicon thin film transistor by plasma is four hours.

* * * * *